United States Patent
Qian et al.

(10) Patent No.: US 9,835,801 B1
(45) Date of Patent: Dec. 5, 2017

(54) EDGE CONSTRUCTION ON OPTICAL DEVICES

(71) Applicant: Mellanox Technologies Silicon Photonics Inc., Monterey Park, CA (US)

(72) Inventors: Wei Qian, Torrance, CA (US); Monish Sharma, Artesia, CA (US)

(73) Assignee: Mellanox Technologies Silicon Photonics Inc., Monterey Park, CA (US)

( * ) Notice: Subject to any disclaimer, the term of this patent is extended or adjusted under 35 U.S.C. 154(b) by 0 days.

(21) Appl. No.: 15/273,615

(22) Filed: Sep. 22, 2016

(51) Int. Cl.
| G02B 6/30 | (2006.01) |
| G02B 6/26 | (2006.01) |
| G02B 6/136 | (2006.01) |
| G02B 6/24 | (2006.01) |
| B81C 3/00 | (2006.01) |
| G02B 6/12 | (2006.01) |

(52) U.S. Cl.
CPC ............ G02B 6/30 (2013.01); G02B 6/136 (2013.01); G02B 6/24 (2013.01); G02B 6/262 (2013.01); B81C 3/005 (2013.01); *B81C 2203/054* (2013.01); *G02B 2006/12173* (2013.01); *G02B 2006/12176* (2013.01)

(58) Field of Classification Search
CPC . G02B 6/30; G02B 6/262; G02B 6/24; G02B 6/136; G02B 2006/12173; G02B 2006/12176; B81C 3/005; B81C 2203/054
See application file for complete search history.

(56) References Cited

U.S. PATENT DOCUMENTS

| 5,259,049 | A | | 11/1993 | Bona et al. | |
| 5,518,965 | A | * | 5/1996 | Menigaux | G02B 6/13 438/27 |
| 5,641,612 | A | * | 6/1997 | Lee | G02B 6/4232 216/24 |
| 5,700,382 | A | * | 12/1997 | Splett | G02B 6/30 216/2 |
| 6,231,771 | B1 | * | 5/2001 | Drake | G02B 6/122 216/2 |
| 6,788,853 | B2 | * | 9/2004 | Steinberg | G02B 6/12 385/49 |
| 6,879,757 | B1 | * | 4/2005 | Zhou | G02B 6/30 385/14 |
| 6,993,225 | B2 | | 1/2006 | Patel | |
| 2004/0114869 | A1 | | 6/2004 | Fike | |

(Continued)

FOREIGN PATENT DOCUMENTS

WO 2015/153504 A1 10/2015

OTHER PUBLICATIONS

Copenheaver, Blaine R., International Search Report and Written Opinion, PCT/US2016/065282, dated Apr. 6, 2017.

*Primary Examiner* — Anita Alanko
(74) *Attorney, Agent, or Firm* — Gavrilovich, Dodd & Lindsey, LLP

(57) ABSTRACT

A method of forming an optical device includes forming a waveguide mask on a device precursor. The device precursor includes a waveguide positioned on a base. The method also includes forming a facet mask on the device precursor such that at least a portion of the waveguide mask is between the facet mask and the base. The method also includes removing a portion of the base while the facet mask protects a facet of the waveguide.

28 Claims, 8 Drawing Sheets

(56) References Cited

U.S. PATENT DOCUMENTS

| | | |
|---|---|---|
| 2004/0130001 A1 | 7/2004 | Headley et al. |
| 2004/0202418 A1 | 10/2004 | Ghiron |
| 2005/0110157 A1 | 5/2005 | Sherrer |
| 2005/0175286 A1 | 8/2005 | Patel |
| 2006/0239605 A1 | 10/2006 | Palen |
| 2008/0213934 A1* | 9/2008 | Martini ................. G02B 6/136 438/57 |
| 2011/0135265 A1 | 6/2011 | Park |
| 2012/0093456 A1* | 4/2012 | Taillaert ............... G02B 6/1228 385/14 |
| 2013/0229701 A1 | 9/2013 | Feng et al. |

* cited by examiner

EDGE CONSTRUCTION ON OPTICAL DEVICES

FIELD

The present invention relates to optical devices and more particularly to construction at the edges of optical devices.

BACKGROUND

Optical systems typically include optical fibers that exchange light signals with planar optical devices. These optical devices often include one or more waveguides that carry the light signals to and/or from one or more optical components on the optical device. The interface between these waveguides and the optical fiber can often be a source of optical loss in the system because the facet of the optical fiber often must be placed undesirably far from the waveguide facet. Reducing or eliminating the distance between the optical fiber facet and the waveguide facet can reduce the level of optical loss associated with this interface. Accordingly, there is a need for an improved interface between the waveguide facet and optical fiber facet.

SUMMARY

A method of forming an optical device includes forming a waveguide mask on a device precursor. The device precursor includes a waveguide positioned on a base. The method also includes forming a facet mask on the device precursor such that at least a portion of the waveguide mask is between the facet mask and the base. The method also includes removing a portion of the base while the facet mask protects a facet of the waveguide. The portion of the base that is removed can be removed such that a recess is defined in the base. The recess can be sized to receive an optical fiber. Additionally, the recess can positioned such that a facet of the optical fiber is aligned with the facet of the waveguide.

In some instances, an optical device precursor includes a waveguide positioned on a base. A waveguide mask is positioned on the waveguide such that the waveguide is between the waveguide mask and the base. A facet mask is positioned such that at least a portion of the waveguide mask is between the facet mask and the base. At least a protective portion of the facet mask is positioned over a facet of the waveguide without the waveguide mask being located between the facet and the protective portion of the facet mask.

BRIEF DESCRIPTION OF THE FIGURES

FIG. 2A is a topview of the device.

FIG. 2B is a cross section of the device taken along the line labeled B in FIG. 2A.

FIG. 2C is a cross section of the device taken along the longitudinal axis of the waveguide.

FIG. 3A is a topview of the system.

FIG. 3B is a topview of the system.

FIG. 3C is a cross section of the system shown in FIG. 3B taken along a line extending between the brackets labeled A in FIG. 3B.

FIG. 4A is a topview of a portion of a device precursor.

FIG. 4B is a topview of the device precursor after formation of a first mask on the device precursor of FIG. 4A followed by etching of the device precursor.

FIG. 4C is a cross section of the device precursor shown in FIG. 4B taken along the longitudinal axis of a waveguide on the device precursor.

FIG. 4D is a topview of the device precursor after formation of a second mask on the device precursor of FIG. 4B.

FIG. 4E is a cross section of the device precursor shown in FIG. 4D taken along the longitudinal axis of a waveguide on the device precursor.

FIG. 4F is a topview of the device precursor after a mask definition etch is performed on the device precursor of FIG. 4D and FIG. 4E.

FIG. 4G is a cross section of the device precursor taken along the longitudinal axis of a waveguide on the device precursor.

FIG. 4H is a topview of the device precursor after a recess etch is performed on the device precursor of FIG. 4F and FIG. 4G.

FIG. 4I is a cross section of the device precursor taken along the longitudinal axis of a waveguide on the device precursor.

FIG. 4J is a topview of the device precursor after remaining portions of the second mask are removed from the device precursor of FIG. 4H and FIG. 4I.

FIG. 4K is a cross section of the device precursor taken along the longitudinal axis of a waveguide on the device precursor.

FIG. 4L is a topview of the device precursor after removing a facet shelf from the device precursor of FIG. 4H and FIG. 4I.

FIG. 4M is a cross section of the device precursor taken along the longitudinal axis of a waveguide on the device precursor.

DESCRIPTION

Due to fabrication processes, planar optical devices typically include a facet shelf positioned under a waveguide facet. The facet typically extends upwards from the facet shelf and the facet shelf typically extends outwards from the facet but on an opposite side of the face from the waveguide. As a result, when the end of an optical fiber is aligned with the waveguide facet, the facet shelf is effectively located between the optical fiber and the waveguide facet. Accordingly, the facet shelf limits how close the optical fiber can be to the waveguide facet. Further, increasing the width of the facet shelf means the optical fiber must be moved further from the waveguide facet. The inventors have found an optical device fabrication method that allows the width of the facet shelf to be reduced or even eliminated.

The method of forming the optical device includes forming a waveguide mask on a device precursor that has a waveguide positioned on a base. The waveguide mask is formed so it protects the waveguide. The device precursor can then be etched so as to form a facet of the waveguide. An edge of the waveguide mask define the location of the facet during the etch. A facet mask can then be formed over the facet of the waveguide while the waveguide mask remains in place on the device precursor. A portion of the base can then be removed while the protective mask protects the waveguide facet and the waveguide mask protects the waveguide. The portion of the base is removed so as to form a recess in the base. The recess is configured such that an optical fiber can be positioned in the recess with a facet of the optical fiber optically aligned with the waveguide facet.

The use of different masks to protect the waveguide and facet during formation of the recess permits the width of the facet shelf to be reduced. As will become evident below, reducing the thickness of the facet mask relative to the waveguide facet reduces the width of the facet shelf and accordingly allows the optical fiber to be moved closer to the waveguide facet. Accordingly, the facet mask can be thin enough to provide the desired facet shelf while the waveguide mask is selected to provide the desired level of waveguide protection during formation of both the recess and the facet. Further, as will become evident below, the presence of the waveguide mask on the device precursor while forming the facet mask eliminates the need to precisely align a mask with the facet. As will also become evident below, the facet mask can be thin enough to provide a facet shelf that is small enough that subsequent processing of the device precursor can eliminate the facet shelf or can even cause the base to undercut the facet.

Figure 1:
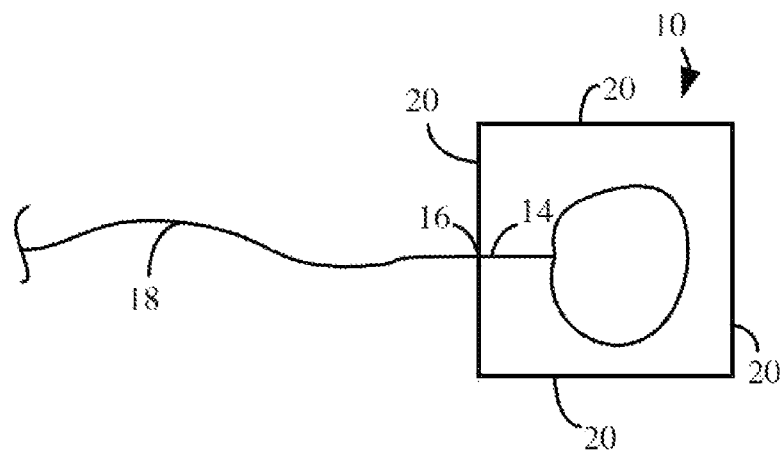
FIG. 1 is a topview of an optical device.

FIG. 1 is a topview of an optical device that includes one or more waveguides 14. Each of the waveguides 14 guides light signals to and/or from one or more optical components. Examples of suitable optical components include, but are not limited to, facets through which light signals can enter and/or exit a waveguide, a taper for changing the mode size of a light signal guide by the waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act a source of a light signal, light sensors such as sensors that convert all or a portion of the light signal to an electrical signal, amplifiers for amplifying the intensity of a light signal, attenuators for attenuating the intensity of a light signal, modulators for modulating a signal onto a light signal, modulators that convert a light signal to an electrical signal, and vias that provide an optical pathway from the bottom side of a device to the top side of the device. Although not illustrated, the devices can optionally include electrical devices.

One or more of the optical components can include electrical components. For instance, the optical components can include contact pads (not shown) for making electrical contact with electronics that are external to the device. As an example, a laser can include contact pads that are to be electrically connected to laser driving electronics that are external to the device. Other optical components that may include contact pads for operating the component include, but are not limited to, light sensors, modulators, amplifiers, attenuators, polarizers, polarization splitters, and heaters.

The waveguide 14 ends at a facet 16 located at a lateral side 20 of the device. The light signals guided by the waveguide 14 can enter and/or exit the waveguide 14 through the facet 16. A light guiding device such as an optical fiber 18 is positioned so as to exchange light signals with the waveguide 14. Accordingly, the optical fiber 18 is optically aligned with the facet 16 of the waveguide 14. Although FIG. 1 illustrates a single waveguide 14 that terminates at a facet 16 positioned at an edge of the device, these devices can include more than one waveguide 14 that terminates at a facet 16 positioned at an edge of the device and/or one or more other waveguides 14.

Figure 2A:
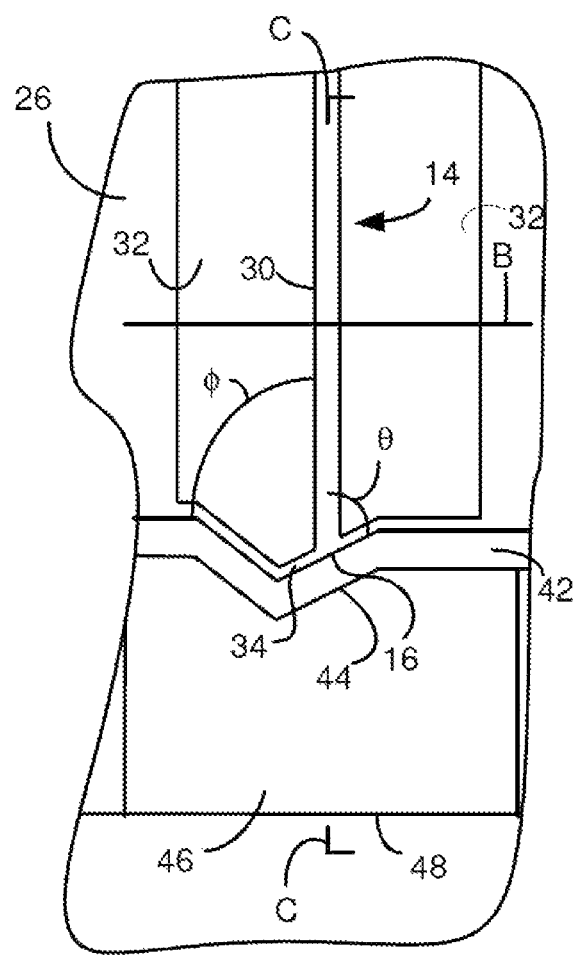
FIG. 2A through FIG. 2C illustrate a portion of an optical device that includes a waveguide and a facet.
Figure 2B:
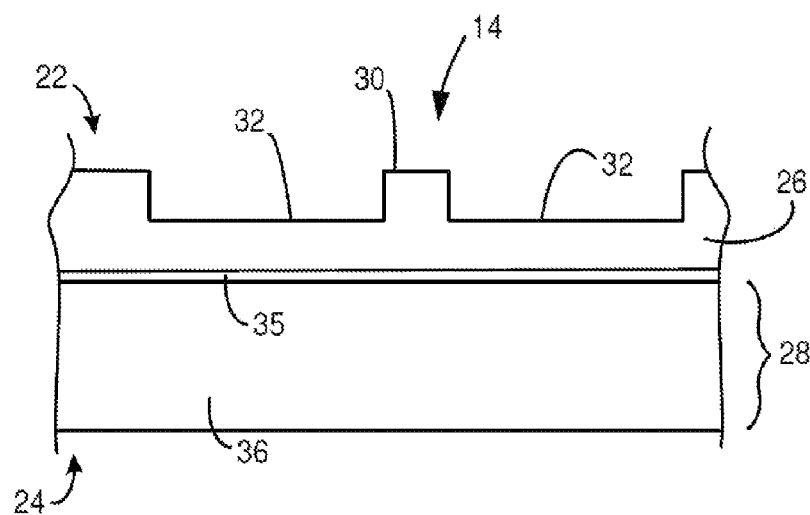
Figure 2C:
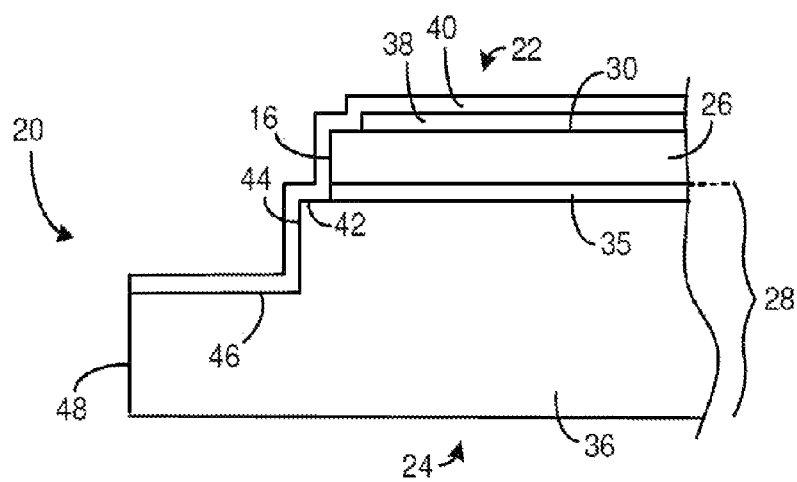

FIG. 2A through FIG. 2C illustrate a portion of an optical device that includes a waveguide 14 and facet 16 arranged as illustrated in FIG. 1. FIG. 2A is a topview of the device. FIG. 2B is a cross section of the device taken along the line labeled B in FIG. 2A. FIG. 2C is a cross section of the device taken along the longitudinal axis of the waveguide 14. For instance, FIG. 2C is a cross section of the device taken along a line extending between the brackets labeled C in FIG. 2A. The portion of the device illustrated in FIG. 2A through FIG. 2C can represents an embodiment of a portion of the device illustrated in FIG. 1.

The device is within the class of optical devices known as planar optical devices. These devices typically include one or more waveguides immobilized relative to a substrate or a base. The direction of propagation of light signals along the waveguides is generally parallel to a plane of the device. Examples of the plane of the device include the top side of the base, the bottom side of the base, the top side of the substrate, and/or the bottom side of the substrate.

The illustrated device includes lateral sides 20 (or edges) extending from a top side 22 to a bottom side 24. The propagation direction of light signals along the length of the waveguides on a planar optical device generally extends through the lateral sides 20 of the device. The top side and the bottom side of the device are non-lateral sides.

The waveguide 14 is defined in a light-transmitting medium 26 positioned on a base 28. The waveguide 14 is partially defined by a ridge 30 extending upward from slab regions of the light-transmitting medium 26. In some instances, the top of the slab region is defined by the bottom of trenches 32 extending partially into the light-transmitting medium 26 or through the light-transmitting medium 26. A flange ridge 34 is also defined in the light-transmitting medium 26 and extends outwards from the ridge 30 at the facet 16. The flange ridge 34 can be an artifact of the fabrication process and, in some instances, is not present in the optical device. When a flange region is on the optical device, the facet 16 corresponds to the portion of the flange region 34 through which the light signals are transmitted to or from the waveguide 14. As a result, the facet can be the portion of the flange region 34 that is optically aligned with the waveguide. Suitable light-transmitting media include, but are not limited to, silicon, polymers, silica, SiN, GaAs, InP and $LiNbO_3$.

The portion of the base 28 adjacent to the light-transmitting medium 26 is configured to reflect light signals from the waveguide 14 back into the waveguide 14 in order to constrain light signals in the waveguide 14. For instance, the portion of the base 28 adjacent to the light-transmitting medium 26 can be an optical insulator 35 with a lower index of refraction than the light-transmitting medium 26. The drop in the index of refraction can cause reflection of a light signal from the light-transmitting medium 26 back into the light-transmitting medium 26. The base 28 can include the optical insulator 35 positioned on a substrate 36. As will become evident below, the substrate 36 can include or consist of one or more materials that transmit light signals. For instance, the substrate 36 can be constructed of a light-transmitting medium 26 that is different from the light-transmitting medium 26 or the same as the light-transmitting medium 26. In one example, the device is constructed on a silicon-on-insulator wafer. A silicon-on-insulator wafer includes a silicon layer that serves as the light-transmitting medium 26. The silicon-on-insulator wafer also includes a layer of silica positioned on a silicon substrate. The layer of silica can serve as the optical insulator 35 and the silicon substrate can serve as the substrate 36.

As is evident from FIG. 2C, a cladding 38 can optionally be positioned on the device. The cladding 38 can be arranged so it is located on the waveguide 14 without being located over the facet 16. For instance, the cladding 38 can be in direct physical contact with the ridge 30 of the light-transmitting medium 26 and the slab regions without being in direct physical contact with the facet 16. Suitable claddings 38 include, but are not limited to, silica and silicon nitride.

As is also shown in FIG. 2C, an anti-reflective coating 40 can be positioned on the device. For instance, the anti-reflective coating 40 can be positioned over the facet 16 such that light signals that enter and/or exit the waveguide 14 through the facet 16 also pass through the anti-reflective coating 40. In some instances, the anti-reflective coating 40 is in direct physical contact with the facet 16. Suitable anti-reflective coatings 40 include, but are not limited to, silica, silicon nitride, aluminum oxide, and hafnium oxide.

The facet 16 extends upwards from a facet shelf 42. The facet shelf 42 extends outward from the facet 16 toward a recess wall 44 and is on an opposite side of the facet 16 from the waveguide 14. In some instances, the facet shelf 42 is parallel or substantially parallel to the top of the base 28 and/or the top of the substrate 36. The recess shelf 46 extends outwards from the recess wall 44 to an edge wall 48. In some instances, the edge wall 48 is the outermost edge of the optical device. Additionally or alternately, the edge wall 48 is perpendicular or substantially perpendicular to the recess shelf 46 and/or the bottom of the substrate 36. As will be evident below, the edge wall 48 can be the portion of the device that is closest to the end of an optical fiber 18 that is exchanging light signals with the waveguide 14 through the facet 16.

The facet 16 extends upwards from the base 28. In some instances, the facet 16 is vertical or substantially vertical relative to the base 28. The facet 16 can also be positioned at an angle that is non-perpendicular relative to the direction of propagation of light signals through the waveguide 14 at the facet 16. In some instances, the facet 16 is substantially perpendicular relative to the base 28 while being non-perpendicular relative to the direction of propagation. The non-perpendicularity of the facet 16 reduces the effects of back reflection. Suitable angles (labeled $\theta$ in FIG. 2A) for the facet 16 relative to the direction of propagation include but are not limited to, angles between 80° and 89°, and angles between 80° and 85°. An angle (labeled $\phi$ in FIG. 2A) between the direction of propagation of light signals through the waveguide 14 at the facet 16 and the plane of the edge wall 48 or the edge of the device can be 90° or substantially 90° or less than 90°. For instance, the angle $\phi$ can be greater than 70° or 80° and/or less than 80° or 90°. The angle $\phi$ and the angle $\theta$ can be selected such that the light signals travels away from the facet 16 at a particular angle and/or enter the waveguide at a particular angle. For instance, the angle $\phi$ and the angle $\theta$ can be selected such that light signals exiting from the waveguide travel away from the device at an angle that is perpendicular or substantially perpendicular to the plane of the edge wall 48 and/or perpendicular or substantially perpendicular to an edge of the device. Additionally or alternately, the angle $\phi$ and the angle $\theta$ can be selected such that light signals entering the waveguide travel through the waveguide in a direction that is parallel or substantially parallel to the direction of propagation of light signals through the waveguide 14 at the facet 16.

Figure 3A:
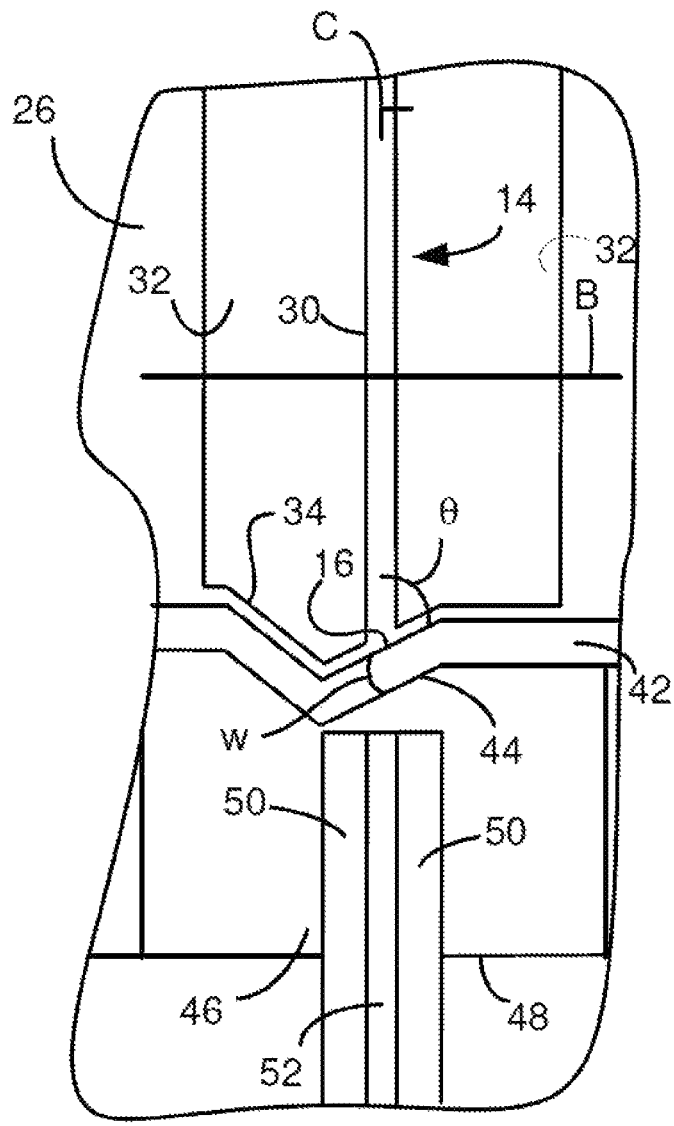
FIG. 3A illustrates a system having an optical fiber interfaced with the optical device of FIG. 2A through FIG. 2C.

The optical device can be interfaced with a light guiding device such that the waveguide 14 can exchange light signals with the light guiding device. For instance, FIG. 3A is a topview of a system that includes an optical fiber positioned on the recess shelf 46. The optical fiber 18 has a cladding 50 surrounding a core 52 that terminates at a fiber facet. The optical fiber is positioned in the recess such that the fiber facet is optically aligned with the waveguide facet 16 to permit an exchange of light signals between the waveguide facet and the fiber facet. In some instances, the core 52 has a diameter greater than 1 µm, 2 µm, or 3 µm and/or less than 4 µm, 7 µm or 10 µm. Additionally or alternately, in some instances, the cladding 50 has a thickness greater than 40 µm, 50 µm, or 60 µm and/or less than 70 µm, 80 µm or 90 µm As is evident from FIG. 3A, the facet shelf 42 prevents the optical fiber 18 from approaching the facet 16 of the waveguide. The width of the facet shelf 42 is labeled "w" in FIG. 3A. The width of the facet shelf 42 is measured in a direct that is perpendicular to the facet 16 and/or to the plane of the facet. Using the methods of fabrication described below, the width of the facet shelf 42 can be greater than or equal to, 0 µm, 0.1 µm, 0.2 µm or 0.3 µm, 0.4 um, or 0.5 µm and/or less than 0.5 µm, 1.0 µm, or 1.5 µm, or 2 um.

Figure 3B:
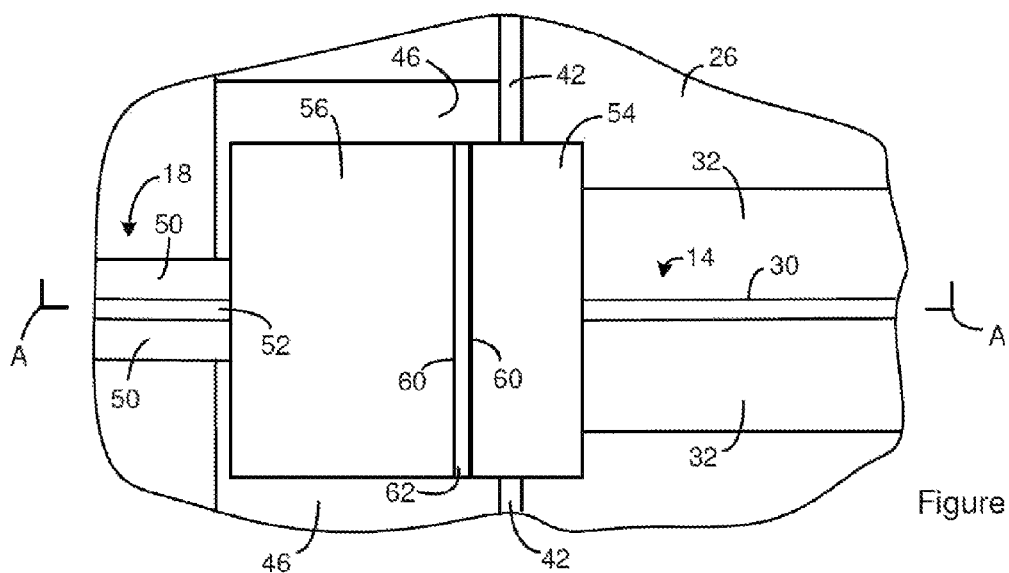
FIG. 3B through FIG. 3C illustrate the system of FIG. 3A used with device mounts that hold the optical fiber in the desired alignment with the waveguide facet.
Figure 3C:
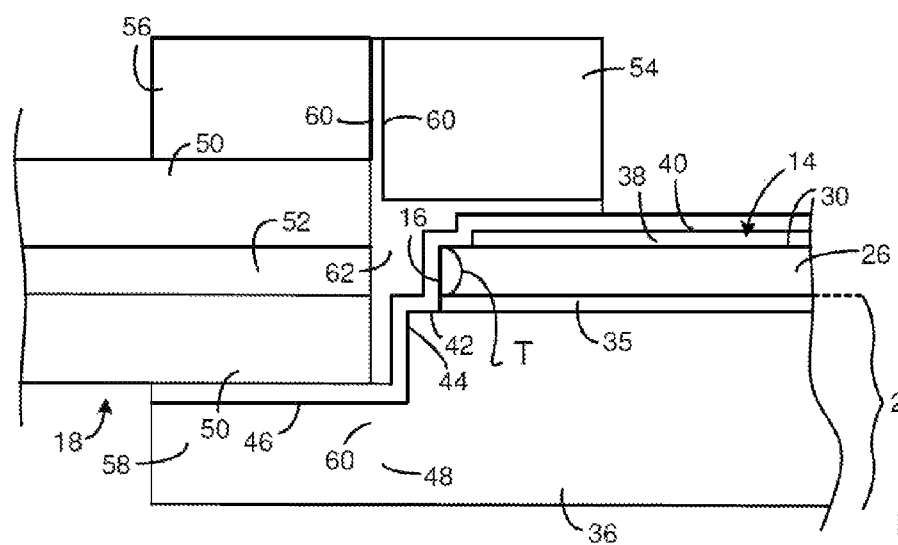

One or more mechanisms can be employed to immobilize the optical fiber relative to the waveguide facet 14. As an example, FIG. 3B through FIG. 3C illustrate the system of FIG. 3A used with device mounts that hold the optical fiber in the desired alignment with the waveguide facet 14. FIG. 3B is a topview of the system. FIG. 3C is a cross section of the system shown in FIG. 3B taken along a line extending between the brackets labeled A in FIG. 3B. The system includes a device mount 54 positioned on the optical device. In some instances, the device mount adds mechanical strength to the assembly. The device mount 54 can be immobilized on the optical device using one or more attachment mechanisms selected from a group consisting of adhesives and/or epoxies. The device mount 54 can be positioned over the ridge 30 and can span the trenches 32. Suitable device mounts 54 include, but are not limited to, blocks. In some instances, the device mounts 54 include or consist of a glass block such as a silica block.

The system also includes an upper mount 56. The upper mount 56 is immobilized relative to the recess shelf 46 with the optical fiber 18 being positioned between the upper mount 56 and the recess shelf 46 and immobilized relative to the upper mount 56 and the recess shelf 46. Although not illustrated, the optical fiber 18 can be positioned in a groove in the upper mount 56 and/or a groove in the recess shelf 46. Suitable mechanisms for immobilizing the upper mount 56, the lower mount 58, and the optical fiber 18 include one or more attachment mechanisms selected from a group consisting of adhesives and/or epoxies. Suitable upper mounts 56 and/or suitable lower mounts 58 members include, but are not limited to, blocks. In some instances, the upper mount 56 and/or lower mount 58 includes or consists of a glass block such as a silica block.

The upper mount 56 and the device mount 54 each include one or more alignment surfaces 60. An alignment surface 60 from the upper mount 56 is bonded to an alignment surface 60 from the device mount 54 such that a core 52 of the optical fiber 18 is optically aligned with the facet 16 of the waveguide 14. Alternately, the mount includes one or more alignment surfaces 60 and the edge wall 48 serves as an alignment surface 60. In some instances, alignment surfaces 60 from the upper mount 56 and device mount 54 are bonded such that a core 52 of the optical fiber 18 is optically aligned with the facet 16 of the waveguide 14.

Suitable mechanisms for bonding the alignment surfaces 60 include, but are not limited to, attachment mechanisms selected from a group consisting of adhesives and/or epoxies. As is evident from FIG. 3C, the attachment mechanism 62 can be located between the alignment surfaces 60 and can also be located between the optical fiber 18 and the optical device. For instance, the attachment mechanism 62 can be located between the core 52 of the optical fiber 18 and facet 16. The use of the upper mount 56 and the device mount 54 are optional. As is evident from the continuous layer of attachment mechanism 62 shown in FIG. 3C, the attachment mechanism 62 that bonds the optical fiber 18 to the optical device can optionally be the same as the attachment mechanism 62 that attached the device mount 54 to the optical device.

When the system includes an attachment mechanism 62 between alignment surfaces 60 as disclosed above, the attachment mechanism 62 can have a thickness greater than or equal to 0 µm, 1 µm, or 2 µm and/or less than 5 µm, 10 µm, or 15 µm. As a result, the distance between the facet of the optical fiber 18 and the facet 16 can be greater than or equal to 0 µm, 1 µm, or 2 µm and/or less than 3 µm, 5 µm, 10 µm, or 15 µm.

In the device of FIG. 3A through FIG. 3C, the angle $\phi$ (angle between the direction of propagation through the waveguide at the facet and the edge wall 48) and the angle $\theta$ (angle between the direction of propagation through the waveguide and the facet 14) can be selected such that if light signals exited from the waveguide through the facet 14, the would travel away from the device in a direction that is perpendicular or substantially perpendicular to the plane of the edge wall 48 and/or perpendicular or substantially perpendicular to an edge of the device. Additionally or alternately, the angle $\phi$ and the angle $\theta$ can be selected such that when the optical fiber is perpendicular or substantially perpendicular to the plane of the edge wall 48 and/or perpendicular or substantially perpendicular to an edge of the device, light signals from the optical fiber enter the waveguide traveling in a direction that is parallel or substantially parallel to the direction of propagation of light signals through the waveguide 14 at the facet 16. In one example, the attachment mechanism 62 is an epoxy with an index of refraction of about 1.5, the angle $\theta$ is 83° and the angle $\phi$ is 80.34°.

FIG. 4A through FIG. 4M illustrate methods for generating an optical device constructed according to FIG. 2A through FIG. 2C. The method is illustrated using a silicon-on-insulator wafer although other wafer platforms can be employed.

Figure 4A:
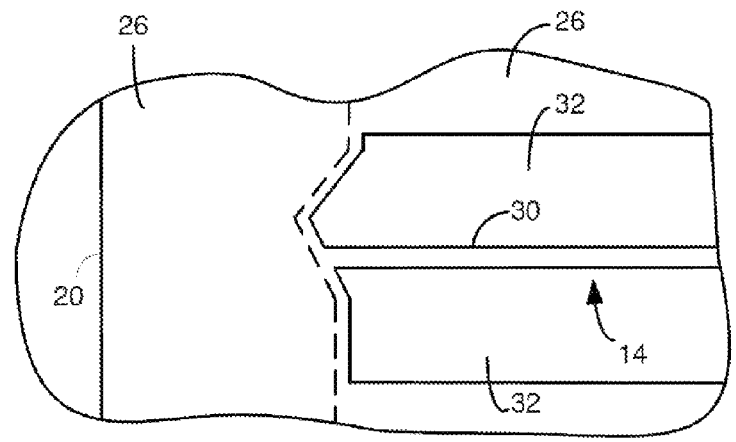
FIG. 4A through FIG. 4M illustrate a method for generating an optical device constructed according to FIG. 2A through FIG. 2C.

FIG. 4A is a topview of a portion of a device precursor. The device precursor is obtained with the ridge 30, trenches 32, and waveguide 14 in the desired locations. The dashed line shown in FIG. 4A illustrates the perimeter of the location where the flange ridge 34 is desired but not yet formed. The trenches 32 that at least partially define the ridge 30, waveguide 14, and flange ridge 34 can be formed using masking and etching techniques.

A first mask 70 is formed on the device precursor of FIG. 4A. The first mask 70 protects the ridge 30, trenches 32, waveguide 14, and region where the flange ridge 34 is to be formed. A portion of the device precursor between the lateral side 20 and the region where the flange ridge 34 will be formed is not protected by the first mask 70. In particular, the region where the facet shelf 42 and recess shelf 46 are to be formed are not covered by the first mask 70 and remain exposed.

Figure 4B:
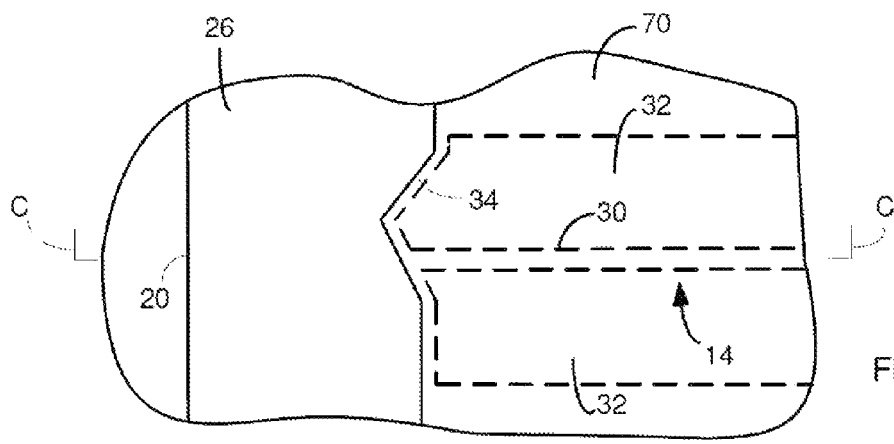
Figure 4C:
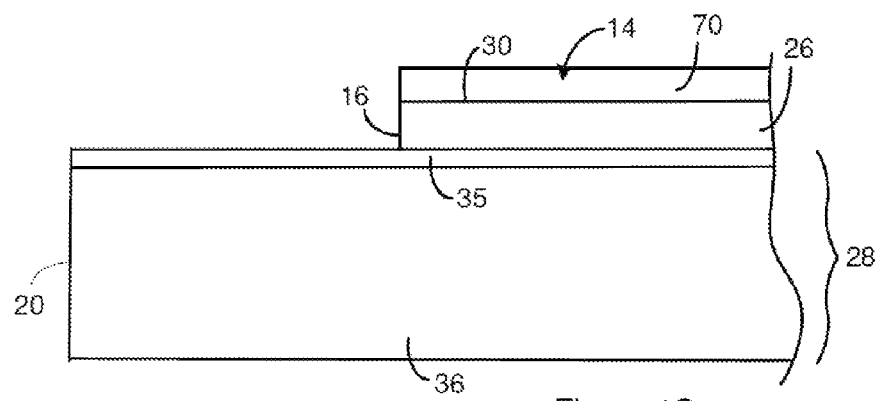

After formation of the first mask 70, a facet etch is performed so as to provide an optical device with the structure of FIG. 4B and FIG. 4C. FIG. 4B is a topview of the device precursor. FIG. 4C is a cross section of the device precursor taken along the longitudinal axis of the waveguide 14. For instance, FIG. 4C can be a cross section of the die 10 shown in FIG. 4B taken along a line between the brackets labeled C in FIG. 4A. The dashed lines in FIG. 4B illustrate the locations of features located under the first mask 70. For instance, the dashed lines in FIG. 4B illustrate the location of the ridge 30, trenches 32, waveguide 14, and a portion of flange ridge 34 under the first mask 70. The facet etch removes light-transmitting medium 26 from between the lateral side 20 and the region where the flange ridge 34 will be formed. For instance, the facet etch removes light-transmitting medium 26 from the region where the facet shelf 42 and recess shelf 46 are to be formed. As a result, the removal of the light-transmitting medium 26 forms the flange ridge 34 and the facet 16 on the waveguide with an edge of the first mask defining the location of the facet on the device precursor. The facet etch can be selected so the optical insulator 35 acts as an etch stop and/or the facet etch can be performed for a duration needed to expose the optical insulator 35. Alternately, the facet etch can be performed for a duration needed to etch through the optical insulator 35. A suitable first mask 70 includes, but is not limited to, a photoresist.

Figure 4D:
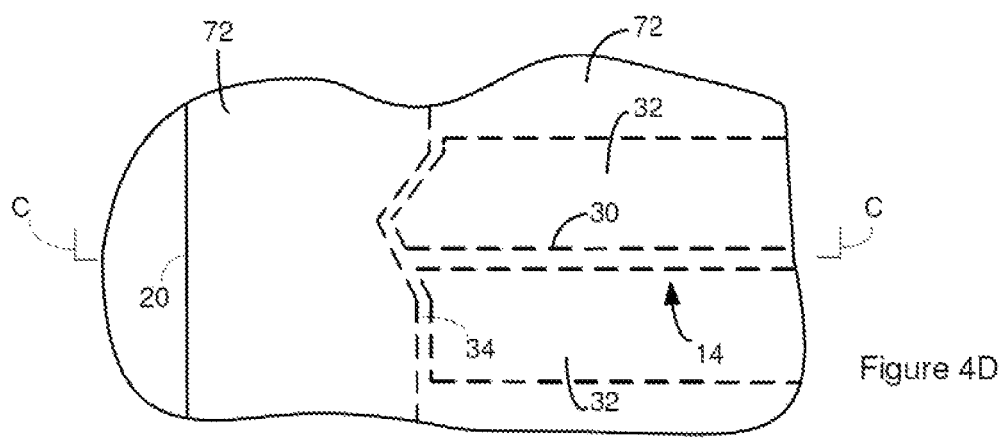
Figure 4E:
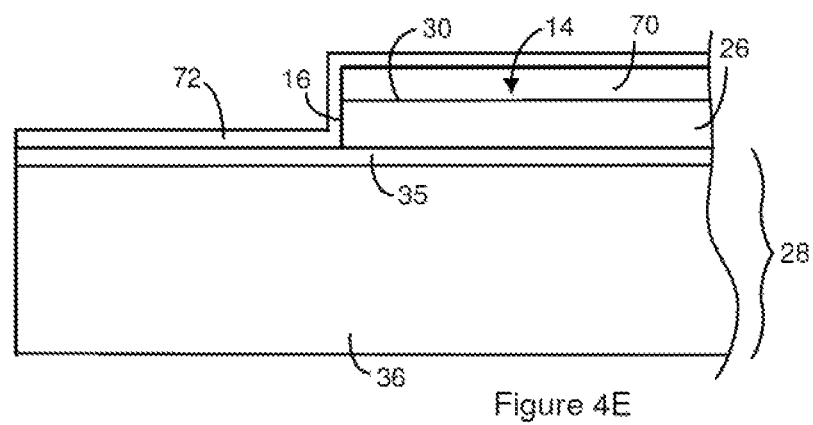

A second mask 72 is formed on the device precursor so as to provide the device precursor of FIG. 4D and FIG. 4E. FIG. 4D is a topview of the device precursor. The dashed lines in FIG. 4D illustrate the locations of features located under the first mask 70. For instance, the dashed lines in FIG. 4D illustrate the location of the ridge 30, trenches 32, waveguide 14, and flange ridge 34 under the first mask 70. FIG. 4E is a cross section of the device precursor taken along the longitudinal axis of the waveguide 14. The second mask is formed over the first mask 70 and also over regions of the device precursor that were not previously protected by the first mask 70. For instance, the portion of the device precursor between the lateral side 20 and the flange ridge 34 are protected by the second mask 72. In particular, the region where the facet shelf 42 and recess shelf 46 are to be formed are protected by the second mask 72.

Figure 4F:
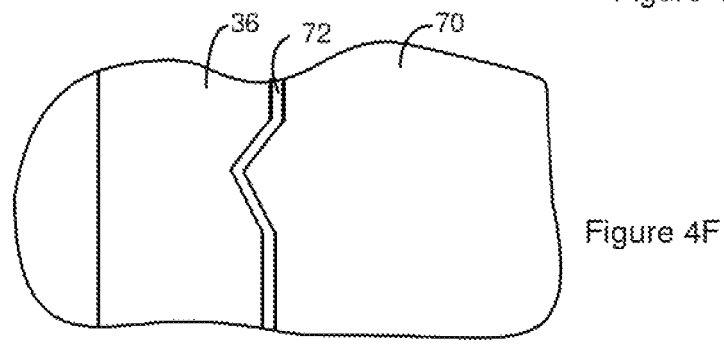
Figure 4G:
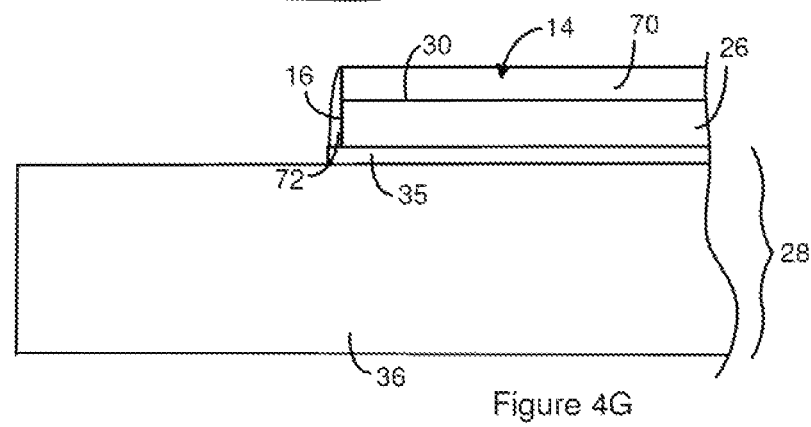

A mask definition etch is performed on the device precursor of FIG. 4D and FIG. 4E so as to produce the device precursor or FIG. 4F and FIG. 4G. FIG. 4F is a topview of the device precursor. FIG. 4G is a cross section of the device precursor taken along the longitudinal axis of the waveguide 14. The mask definition etch is performed for a duration that removes the second mask 82 from the horizontal surfaces of the device precursor without removing the portion of the second mask 82 over the facet 16. The remaining portion of the second mask continues to protect the facet 16 but the second mask is no longer positioned over the first mask 70 and the recess shelf 46 that is to be formed. Accordingly, remaining portion of the second mask serves as a protective mask for the facet. This protective mask was formed over the facet without the need to accurately align a mask with the facet. As is most evident from FIG. 4G, the mask definition etch can optionally be performed for a duration sufficient to remove the portion of the optical insulator 35 that was in physical contact with the second mask 72. The mask definition etch can be an anisotropic etch. An example of a suitable mask definition etch includes, but is not limited to, chemical dry etch, sputter etch, and reactive ion etch (RIE).

Figure 4H:
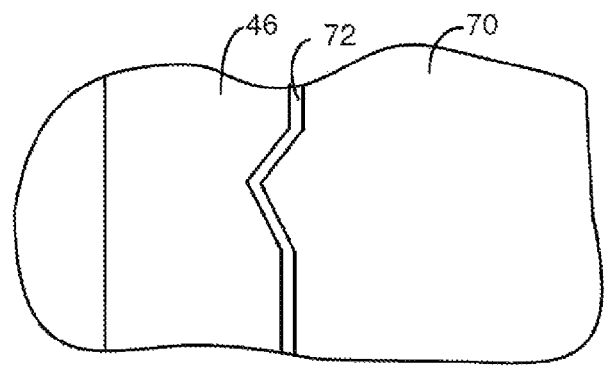
Figure 4I:
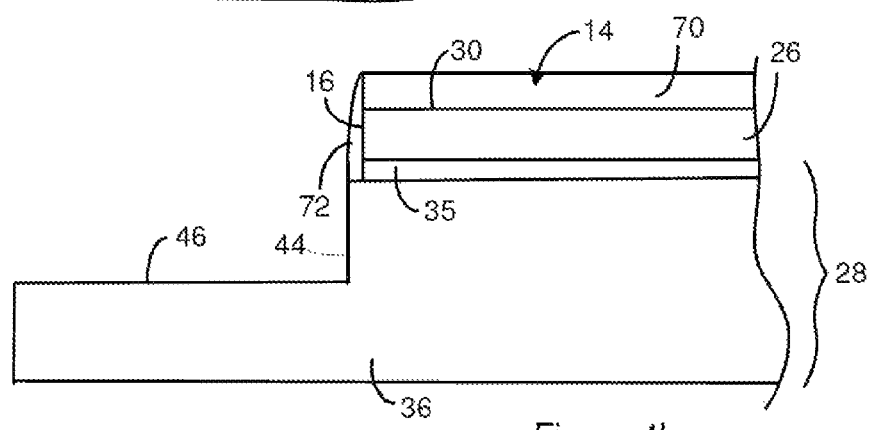

A recess etch is performed on the device precursor of FIG. 4F and FIG. 4G so as to produce the device precursor or FIG. 4H and FIG. 4I. FIG. 4H is a topview of the device precursor. FIG. 4I is a cross section of the device precursor taken along the longitudinal axis of the waveguide 14. The recess etch removes the portion of the substrate 36 over the recess shelf 46 and can be performed for a duration that is sufficient for the recess shelf 46 to be formed at the desired depth in the base. During the recess etch, the first mask protects the waveguide and a remaining portion of the second mask 72 (the protective mask) protects the facet. The recess etch can be an anisotropic etch. An example of a suitable mask definition etch includes, but is not limited to, a chemical dry etch, a plasma etch, a sputter etch and reactive ion etch (ME).

Figure 4J:
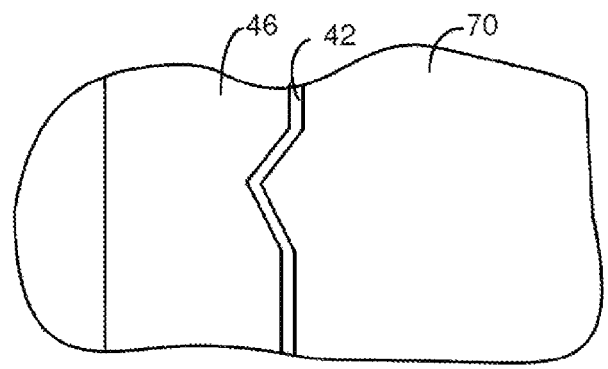
Figure 4K:
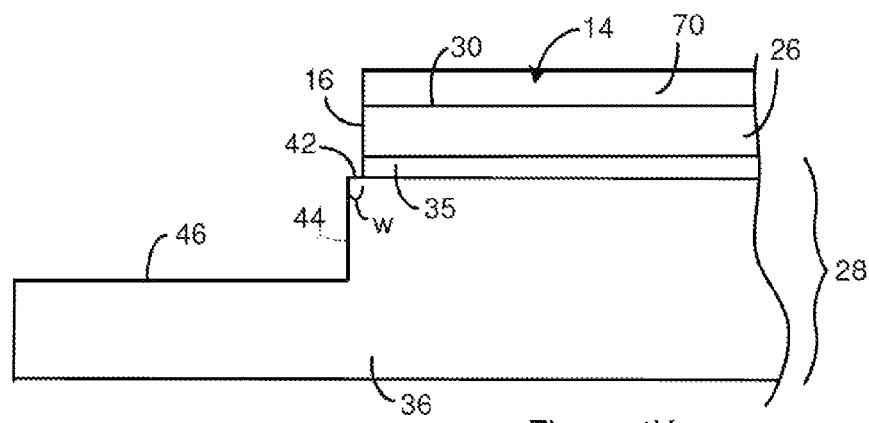

The remaining portions of the second mask 72 can be removed from the device precursor of FIG. 4H and FIG. 4I so as to produce the device precursor or FIG. 4J and FIG. 4K. FIG. 4J is a topview of the device precursor. FIG. 4K is a cross section of the device precursor taken along the longitudinal axis of the waveguide 14. Suitable methods for removing the second mask 72 include, but are not included to, a wet etch, a reactive ion etch (ME), and a plasma etch. The removal of the second mask exposes the facet shelf 42. As is evident from the transition from FIG. 4I to FIG. 4K, the thickness of the portion of the second mask 72 that protects the facet during the recess etch determines the width of the facet shelf 42 (labeled w in FIG. 4K). Accordingly, the thickness of the second mask 72 determines the width of the facet shelf 42 (labeled w in FIG. 4K). In order for a photoresist to effectively protect the facet 16 during the recess etch, the photoresist often must have a thickness that results in an undesirably wide facet shelf. As a result, a photoresist is often not effective as the second mask 72. Suitable second masks include, but are not limited to, silicon oxide, nitride, and polymer. Suitable methods of forming the second mask on the device precursor include, but are not limited to, chemical dry etch, sputter etch, and reactive ion etch (ME).

The thickness of at least a portion of the second mask located over the facet before or at the start of the recess etch is greater than 0.1 um, 0.2 um, or 0.3 um and/or less than 0.4 um, 0.5 um or 0.6 um where the thickness is measured in a direction perpendicular to the facet. As is evident from FIG. 4G, the thickness of the portion of the second mask 72 over the facet before or at the start of the recess etch can vary across the facet. The maximum thickness of the portion of the second mask 72 over the facet before or at the start of the recess etch can be greater than 0.1 um, 0.2 um or 0.3 um and/or less than 0.4 um, 0.5 um or 0.6 um where the thickness is measured in a direction perpendicular to the facet. These dimensions for the portion of the second mask located over the facet before or at the start of the recess etch can be achieved when the second mask 72 is initially formed with a thickness greater than 0.1 um, 0.2 um, 0.3 um and/or less than 0.4 um, 0.5 um, or 0.6 um over the first mask 70 where the thickness is measured in a direction that is perpendicular to the first mask 70. Second mask materials that can provide the above dimensions include, but are not limited to, nitride, oxide, and polymer. Suitable methods for applying these materials to the device precursor include, but are not limited to, Plasma-enhanced chemical vapor deposition (PECVD), low-pressure chemical vapor deposition (LPCVD), and thermal oxidation.

The first mask 70 can optionally be removed from the device precursor of FIG. 4J and FIG. 4K to prove the optical device of FIG. 2A and/or for additional processing of the device precursor. A suitable method for removing the first mask 70 includes, but is not limited to, a wet etch, and a dry etch.

Figure 4L:
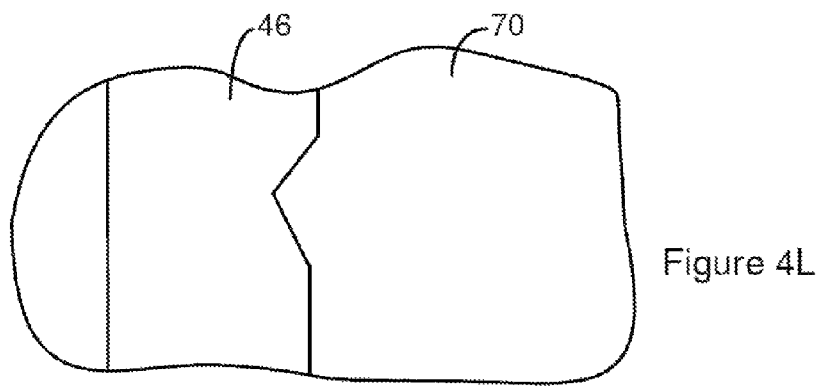
Figure 4M:
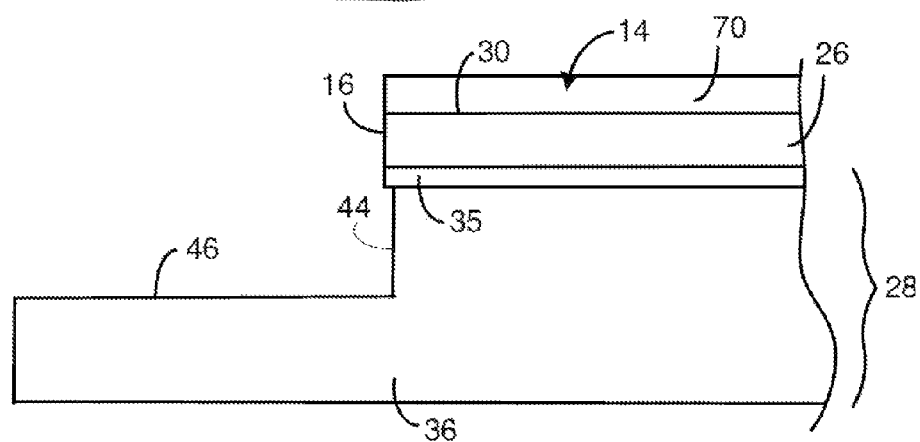

In some instances, the facet shelf 42 is removed or the width of the facet shelf 42 is reduced. For instance, the facet shelf 42 can be removed or reduced from the device precursor of FIG. 4H and FIG. 4I so as to produce the device precursor or FIG. 4L and FIG. 4M. FIG. 4L is a topview of the device precursor. FIG. 4M is a cross section of the device precursor taken along the longitudinal axis of the waveguide 14. In some instances, the facet shelf 42 is removed or reduced by performance of a shelf reduction etch on the device precursor of FIG. 4H and FIG. 4I. The shelf reduction etch can be an isotropic etch such as a wet etch. As is evident from FIG. 4M, the shelf reduction etch can remove the portion of the second mask 72 that is still present on the facet 16. In some instances, the shelf reduction etch can performed for a period of time that reduces the width of the shelf reduction etch without bringing the recess wall 44 flush with the facet 16. Alternately, the shelf reduction etch can performed for a period of time that brings the recess wall 44 flush or substantially flush with the facet 16. Alternately, the shelf reduction etch can performed for a period of time that undercuts the light-transmitting medium 26 and/or optical insulator 35 as is illustrated in FIG. 4M. When an isotropic etch is used for the shelf reduction etch, the isotropic etch may also remove the portion of the substrate 36 that defines the recess shelf 46. The duration of the recess etch can be adjusted as needed to compensate for the removal of additional substrate 36 by the shelf reduction etch and accordingly for the recess shelf 46 at the desired depth in the substrate. Suitable isotropic etches for the shelf reduction etch include, but are not limited to, a wet etch, a plasma etch, and a reactive ion etch (ME).

The first mask 70 can optionally be removed from the device precursor of FIG. 4J and FIG. 4K to provide the optical device of FIG. 2A and/or for additional processing of the device precursor. A suitable method for removing the first mask 70 includes, but is not limited to, a wet etch, a plasma etch, and a reactive ion etch (ME).

Although the methods disclosed in conjunction with FIG. 4A through FIG. 4M show the waveguide formed in the device precursor before formation of the waveguide facet, the waveguide can be formed in a device precursor after formation of the waveguide facet and/or after formation of the recess shelf.

Although the invention disclosed above are disclosed in the context of an optical fiber, the methods, devices, and device precursors can be used with other light sources. For instance, the optical devices disclosed above can receive signals light from guided sources such as the waveguides of other optical devices or from an unguided light source such as lasers.

Although the above methods, devices, and device precursors disclose a recess shelf 46 with a flat bottom, the recess shelf can be formed with a variety of other configurations. For instance, the bottom of the recess shelf can have a v-groove or other configuration.

The methods of device fabrication disclosed in conjunction with FIG. 4A through FIG. 4M are disclosed in the context of an optical device precursor that is separated from a wafer; however, these methods can be employed when multiple device precursors or dies are present on the same wafer. The different optical devices, device precursors, or dies on the wafer can be separated from one another after performing all or a portion of the disclosed methods using known techniques such as dicing.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A method of forming an optical device, comprising:
    forming a waveguide mask on a device precursor,
        the device precursor including a waveguide positioned on a base;
    forming a facet mask on the device precursor such that at least a portion of the waveguide mask is between the facet mask and the base; and
    forming a recess in the base while a protective portion of the facet mask is over a facet of the waveguide, the protective portion of the facet mask also being over a facet shelf that extends from a side of the recess.

2. The method of claim 1, further comprising:
    placing an optical fiber in the recess such that a facet of the optical fiber is aligned with the facet of the waveguide.

3. The method of claim 1, further comprising:
    removing a portion of the device precursor after forming the waveguide mask and before forming the facet mask, the portion of the device precursor being removed so as to define the facet on the device precursor.

4. The method of claim 1, wherein the side of the recess is less than 0.5 µm from the facet.

5. The method of claim 1, further comprising:
    removing a first portion of the facet mask from over the waveguide after forming the facet mask and before forming the recess.

6. The method of claim 5, wherein a thickness of the protective portion of the facet mask over the facet is less than 0.5 µm, where the thickness is measured in a direction perpendicular to the facet.

7. The method of claim 6, wherein the thickness of the protective portion of the facet mask varies across the facet and a maximum of the thickness is less than 0.5 µm.

8. The method of claim 5, further comprising:
    removing the protective portion of the facet mask.

9. The method of claim 1, wherein the facet mask is not a photoresist.

10. The method of claim 9, wherein the waveguide mask is a photoresist.

11. The method of claim 1, wherein the waveguide and the facet shelf are located on opposing sides of the facet.

12. The method of claim 1, wherein the facet shelf has a width less than 0.5 µm.

13. The method of claim 1, wherein after forming the recess, the facet is flush with a portion of the base.

14. The method of claim 1, wherein after forming the recess a second portion of the base that remains on the device precursor undercuts the waveguide.

15. The method of claim 1, further comprising:
    removing from the device precursor the protective portion of the facet mask.

16. The method of claim 15, wherein the waveguide and the facet shelf are located on opposing sides of the facet, and the protective portion of the facet mask is removed such that a thickness of the facet shelf is reduced, the thickness of the facet shelf being measured in a direction that is perpendicular to a plane that includes the facet.

17. A method of forming an optical device, comprising:
    forming a waveguide mask on a device precursor,
        the device precursor including a waveguide positioned on a base;
    forming a facet mask on the device precursor such that at least a portion of the waveguide mask is between the facet mask and the base; and
    removing a portion of the base while the facet mask protects a facet of the waveguide, the portion of the base being removed such that after removing the portion of the base the facet is above a facet shelf that extends outward from a plane that includes the facet with the waveguide and the facet shelf being on opposing sides of the facet, the facet shelf having a width less than 0.5 µm.

18. The method of claim 17, wherein removing the portion of the base forms a recess in the base and further comprising:
    placing an optical fiber in the recess such that a facet of the optical fiber is aligned with the facet of the waveguide.

19. The method of claim 17, wherein removing the portion of the base forms a recess in the base and a side of the recess is less than 0.5 µm from a plane that includes the facet.

20. The method of claim 17, further comprising:
    removing a first portion of the facet mask from over the waveguide after forming the facet mask and before removing the portion of the base.

21. A method of forming an optical device, comprising:
    forming a waveguide mask on a device precursor,
        the device precursor including a waveguide positioned on a base;
    forming a facet mask on the device precursor such that at least a portion of the waveguide mask is between the facet mask and the base;
    removing a portion of the base while the facet mask protects a facet of the waveguide, the portion of the base being removed such that after removing the portion of the base the facet is above a facet shelf that extends outward from a plane that includes the facet with the waveguide and the facet shelf being on opposing sides of the facet; and
    removing from the device precursor a protective portion of the facet mask, the protective portion of the facet mask being a portion of the facet mask that remains on the device precursor after the portion of the base is removed, the protective portion of the facet mask being removed such that a thickness of the facet shelf is reduced, the thickness of the facet shelf being measured in a direction that is perpendicular to a plane that includes the facet.

22. The method of claim 21, wherein removing the portion of the base forms a recess in the base and further comprising:
    placing an optical fiber in the recess such that a facet of the optical fiber is aligned with the facet of the waveguide.

23. The method of claim 21, wherein removing the portion of the base forms a recess in the base and a side of the recess is less than 0.5 µm from a plane that includes the facet.

24. The method of claim 21, further comprising:
removing a first portion of the facet mask from over the waveguide after forming the facet mask and before removing the portion of the base.

25. A method of forming an optical device, comprising:
forming a waveguide mask on a device precursor,
the device precursor including a waveguide positioned on a base;
forming a facet mask on the device precursor such that at least a portion of the waveguide mask is between the facet mask and the base; and
removing a portion of the base while the facet mask protects a facet of the waveguide, the portion of the base being removed such that after removing the portion of the base a second portion of the base that remains on the device precursor undercuts the waveguide.

26. The method of claim 25, wherein removing the portion of the base forms a recess in the base and further comprising:
placing an optical fiber in the recess such that a facet of the optical fiber is aligned with the facet of the waveguide.

27. The method of claim 25, wherein removing the portion of the base forms a recess in the base and a side of the recess is less than 0.5 µm from a plane that includes the facet.

28. The method of claim 25, further comprising:
removing a first portion of the facet mask from over the waveguide after forming the facet mask and before removing the portion of the base.

* * * * *